(12) United States Patent
Kobayashi

(10) Patent No.: US 8,237,261 B2
(45) Date of Patent: Aug. 7, 2012

(54) SEMICONDUCTOR DEVICE

(75) Inventor: Nobuyuki Kobayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 247 days.

(21) Appl. No.: 12/801,209

(22) Filed: May 27, 2010

(65) Prior Publication Data

US 2010/0314773 A1   Dec. 16, 2010

(30) Foreign Application Priority Data

Jun. 15, 2009   (JP) ................. 2009-142806

(51) Int. Cl.
*H01L 23/34* (2006.01)

(52) U.S. Cl. .................... 257/706; 257/711; 257/720

(58) Field of Classification Search .......... 257/706–722, 257/E23.051
See application file for complete search history.

(56) References Cited

U.S. PATENT DOCUMENTS

| 6,432,809 | B1 * | 8/2002 | Tonti et al. ............ 438/618 |
| 7,098,070 | B2 * | 8/2006 | Chen et al. ............ 438/106 |
| 7,719,841 | B2 | 5/2010 | Yamashita et al. |
| 8,129,609 | B2 * | 3/2012 | Chen et al. ............ 136/224 |
| 2002/0036330 | A1 | 3/2002 | Kobayashi |

FOREIGN PATENT DOCUMENTS

| JP | 2002-110950 | 4/2002 |
| JP | 2008-203376 | 9/2008 |

* cited by examiner

*Primary Examiner* — Cuong Q Nguyen
(74) *Attorney, Agent, or Firm* — McGinn IP Law Group, PLLC

(57) ABSTRACT

A semiconductor device has: a radiator plate that is maintained at a predetermined potential; an SOI (Silicon On Insulator) chip mounted on the radiator plate; and thermal grease applied to an interface between the radiator plate and the SOI chip. The SOI chip has: a first silicon substrate forming a circuit element part; a second silicon substrate facing the radiator plate; and an insulating film formed between the first silicon substrate and the second silicon substrate. The first silicon substrate and the second silicon substrate are electrically connected to each other. The thermal grease is conductive and electrically connects the second silicon substrate and the radiator plate.

6 Claims, 8 Drawing Sheets

SEMICONDUCTOR DEVICE

INCORPORATION BY REFERENCE

This application is based upon and claims the benefit of priority from Japanese patent application No. 2009-142806, filed on Jun. 15, 2009, the disclosure of which is incorporated herein in its entirety by reference.

BACKGROUND OF THE INVENTION

1. Field of the Invention

The present invention relates to a semiconductor device having a PDP (Plasma Display Panel) address driver IC.

2. Description of Related Art

A PDP driver IC (Integrated Circuit) includes a scan driver IC for driving scanning lines and an address driver IC for driving data lines. The address driver IC is provided with a low-voltage logic part and a high-voltage output part. FIG. 1 is a diagram showing a configuration example of an output cell of the address driver IC. A single output cell has the high-voltage output part 10 and the low-voltage logic part 11, and many output cells are integrated on a chip of the address driver IC.

The low-voltage logic part 11 includes a CMOS circuit. The low-voltage logic part 11 is connected to power supply potential VDD1 and ground (GND) potential VSS1. The low-voltage logic part 11 receives image data from a former-stage circuit and generates a drive signal to output it to the high-voltage output part 10. The high-voltage output part 10 includes a high-voltage N-channel MOSFET (Metal Oxide Semiconductor Field Effect Transistor) (hereinafter referred to as an HVNch) and a high-voltage P-channel MOSFET (hereinafter referred to as an HVPch). The high-voltage output part 10 is connected to power supply potential VDD2 and GND potential VSS2. The high-voltage output part 10 outputs a PDP drive voltage based on the drive signal received from the low-voltage logic part 11.

The high-voltage output part 10 and the low-voltage logic part 11 are different in the power supply potential used. The VDD1 used in the low-voltage logic part 11 is generally on the order of several volts such as 3.3 V to 5.0 V. Whereas, the VDD2 used in the high-voltage output part 10 is tens of volts to hundreds of volts. The VSS1 of the low-voltage logic part 11 and the VSS2 of the high-voltage output part 10 are connected within the chip through a resistor R.

FIG. 2 is a diagram showing a configuration example of the address driver IC of a TCP (Tape Carrier Package). The address driver IC is provided with a plurality of output cells on a single chip. In FIG. 2, the high-voltage output parts 10-1 to 10-3 of the plurality of output cells are illustrated. In practice, the address driver IC 200 is provided with a lot more (e.g. 192) output cells on a single chip. Each of the high-voltage output parts 10-1 to 10-3 is connected to a system power supply through a VDD2 terminal to receive the VDD2 and also is connected to a system GND through a VSS2 terminal to receive the VSS2.

In this manner, lots of high-voltage output parts 10 are connected to the power supply line of the address driver IC. Therefore, when a switching operation is carried out simultaneously in a plurality of high-voltage output parts 10, a large current flows from the VSS2 terminal to the system GND. At this time, rising or ringing of the VSS2 potential is caused by characteristic impedance mismatch on wiring between the VSS2 terminal and the system GND, which causes fluctuation in the VSS2 potential. Such fluctuation in the VSS2 potential leads to logic malfunction of the high-voltage output part 10. Moreover, the fluctuation in the VSS2 potential also affects the VSS1 potential connected to the VSS2 through the resistor, which leads to malfunction of the low-voltage logic part 11.

These problems described above can be solved by reducing a drive current of the PDP panel or reducing impedance on a wiring (hereinafter referred to as wiring impedance). However, the drive current of the PDP panel depends on characteristics of the PDP panel and it is thus difficult to change the drive current. Therefore, techniques for reducing the wiring impedance have been considered. A related technique is as follows.

Japanese Patent Publication JP-2008-203376A (hereinafter referred to as Patent Document 1) discloses a semiconductor device used as a driver IC for driving in a flat panel display which can be implemented using a single-layer wiring board, the semiconductor device inhibiting an increase in impedance caused by long power supply wiring inside a flip chip associated with multi-pin outputs as well as a voltage drop at the longitudinally opposite ends of the inside of the flip chip, while enabling heat dissipation, power supply potential and system GND to be enhanced in spite of increased driving loads resulting from an increased size of a screen.

The semiconductor device described in the Patent Document 1 includes a semiconductor element on which an element electrode is provided, and a single-layer wiring board on which a board electrode electrically connected to the element electrode is provided. The semiconductor element is mounted on the single-layer wiring board. The semiconductor device is provided with a connector part, one or more radiator plates, a relay electrode part, and one or more connecting members. The connector part is provided at an end of the single-layer wiring board and receives an external signal including a first potential and a second potential for driving the semiconductor element. The radiator plate has electrical and thermal conductivity used for transmitting the first potential and/or the second potential. The relay electrode part is provided at one or a plurality of locations on the single-layer wiring board. The connecting member, which has electrical conductivity, is placed between the radiator plate and the relay electrode part to electrically connect the radiator plate and the relay electrode part together. The single-layer wiring board is structured so that the first potential and/or the second potential received by the connector part is transmitted to the element electrode of the semiconductor element through a path including the radiator plate, the relay electrode part, the connecting member and the board electrode.

The semiconductor device of the Patent Document 1 will be described referring to FIG. 3. FIG. 3 is a cross sectional view showing the configuration of the semiconductor device of the Patent Document 1. In FIG. 3, a semiconductor chip 100 is packaged in the TCP form. As shown in FIG. 3, a radiator plate 150 has a recess for mounting the semiconductor chip 100. The semiconductor chip 100 is placed in the recess on the radiator plate 150. Nonconductive thermal grease 160 being an insulating layer is applied to an interface between the radiator plate 150 and the semiconductor chip 100 to electrically isolate the semiconductor chip 100 and the radiator plate 150 from each other. The semiconductor chip 100 is provided with a high-voltage output part 101 and a low-voltage logic part. It should be noted that illustration of the low-voltage logic part is omitted in FIG. 3. The high-voltage output part 101 is connected to a VDD2 wiring 102 through a via to receive the power supply potential VDD2. Moreover, the high-voltage output part 101 is electrically connected to an inner lead (Lead Wire) 120 of the TCP through an output wiring 103, an output pad 104 and a bump 110. The high-voltage output part 101 outputs an output signal through the inner lead 120.

A terminal of the HVNch of the high-voltage output part 101 is connected to a VSS2 wiring 105 through a via. The VSS2 wiring 105 is connected to a VSS2 pad 106 through a via. A bump 111 is provided on the VSS2 pad 106 on a surface of the semiconductor chip 100. The bump 111 is connected to an inner lead 121 of the TCP. The inner lead 121 is formed on a base film 141 that is fixed to the radiator plate 150 by a double-faced tape 142. A surface of the inner lead 121 is covered with solder resist 140. A connecting member (screw) 130 penetrates the solder resist 140, the inner lead 121, the base film 141 and the double-faced tape 142 to be connected to the radiator plate 150. The connecting member 130 electrically connects the inner lead 121 and the radiator plate 150. The radiator plate 150 is connected to the system GND and is maintained at a predetermined potential. Thus, a predetermined potential is supplied to the high-voltage output part 101 through the VSS2 wiring 105, the VSS2 pad 106, the bump 111, the inner lead 121, the connecting member 130 and the radiator plate 150.

According to the semiconductor device of the Patent Document 1, the radiator plate 150 and the VSS2 pad 106 are electrically connected with each other through the connecting member 130, which can suppress high impedance due to a long wiring within the semiconductor chip 100. It is thus possible to enhance the system GND of the driver IC for driving.

The inventor of the present application has recognized the following points. In the case of the semiconductor device described in the Patent Document 1, the path from the VSS2 pad 106 of the semiconductor chip 100 to the system GND needs to pass through the bump 106, the inner lead 121, the connecting member 130 and the radiator plate 150. A resistance component of the wiring impedance increases with increase in the wiring length. Thus, in the case of the semiconductor device described in the Patent Document 1, the GND potential cannot be sufficiently stabilized when the drive load further increases due to increase in the size of the PDP panel. It is therefore required for the address driver IC to decrease the wiring impedance between the address driver IC and the system GND to further stabilize the GND potential.

SUMMARY

In one embodiment of the present invention, a semiconductor device is provided. The semiconductor device has: a radiator plate that is maintained at a predetermined potential; an SOI (Silicon On Insulator) chip mounted on the radiator plate; and thermal grease applied to an interface between the radiator plate and the SOI chip. The SOI chip has: a first silicon substrate forming a circuit element part; a second silicon substrate facing the radiator plate; and an insulating film formed between the first silicon substrate and the second silicon substrate. The first silicon substrate and the second silicon substrate are electrically connected to each other. The thermal grease is conductive and electrically connects the second silicon substrate and the radiator plate.

According to the present invention, the wiring length between the system GND and the address driver IC can be reduced and thus the wiring impedance can be reduced. It is thus possible to suppress the fluctuation in the VSS2 potential caused by an operation of the high-voltage output part and to further stabilize the GND potential of the address driver IC.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
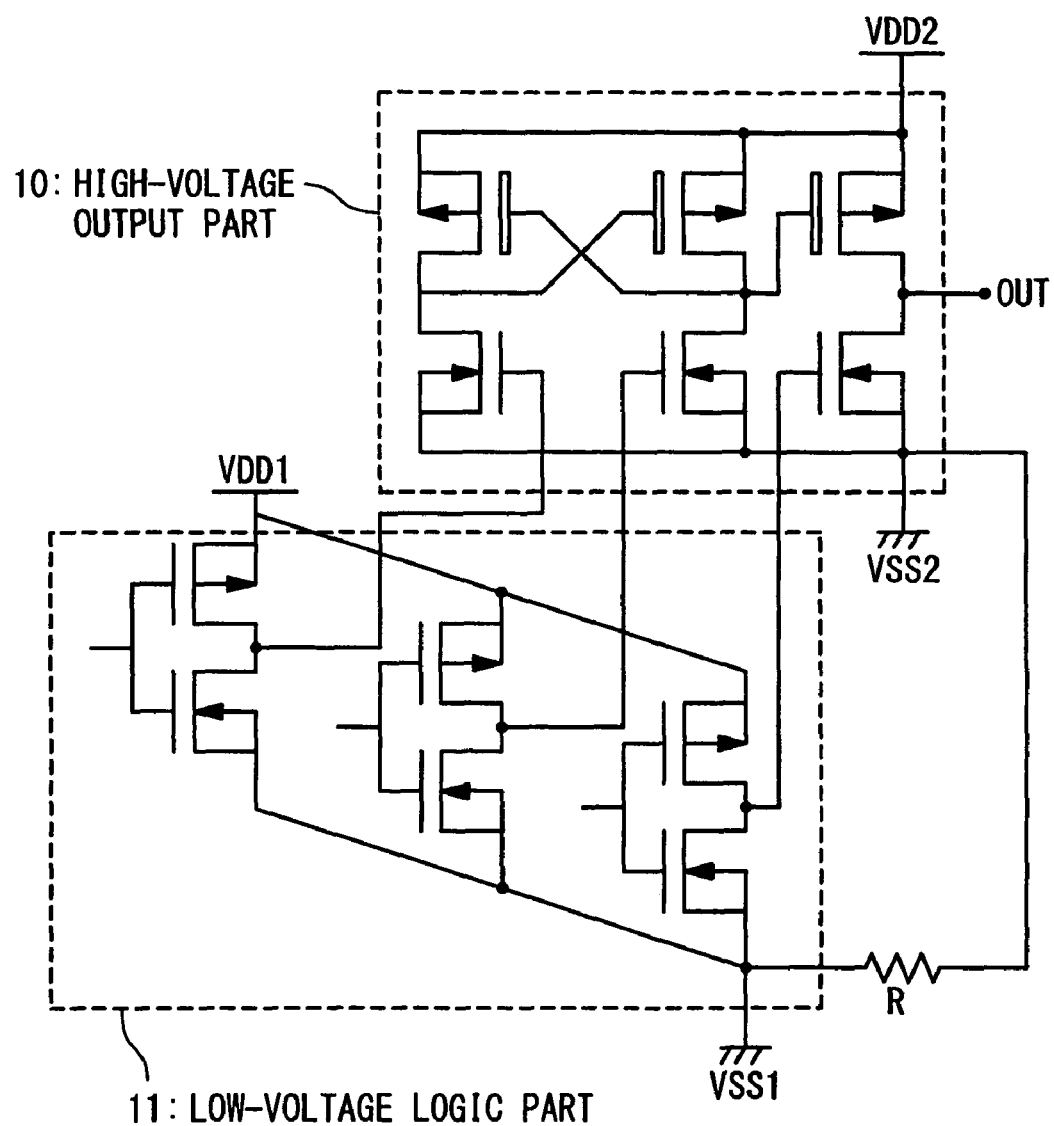
FIG. 1 is a diagram showing a configuration example of an output cell of an address driver IC.
Figure 2:
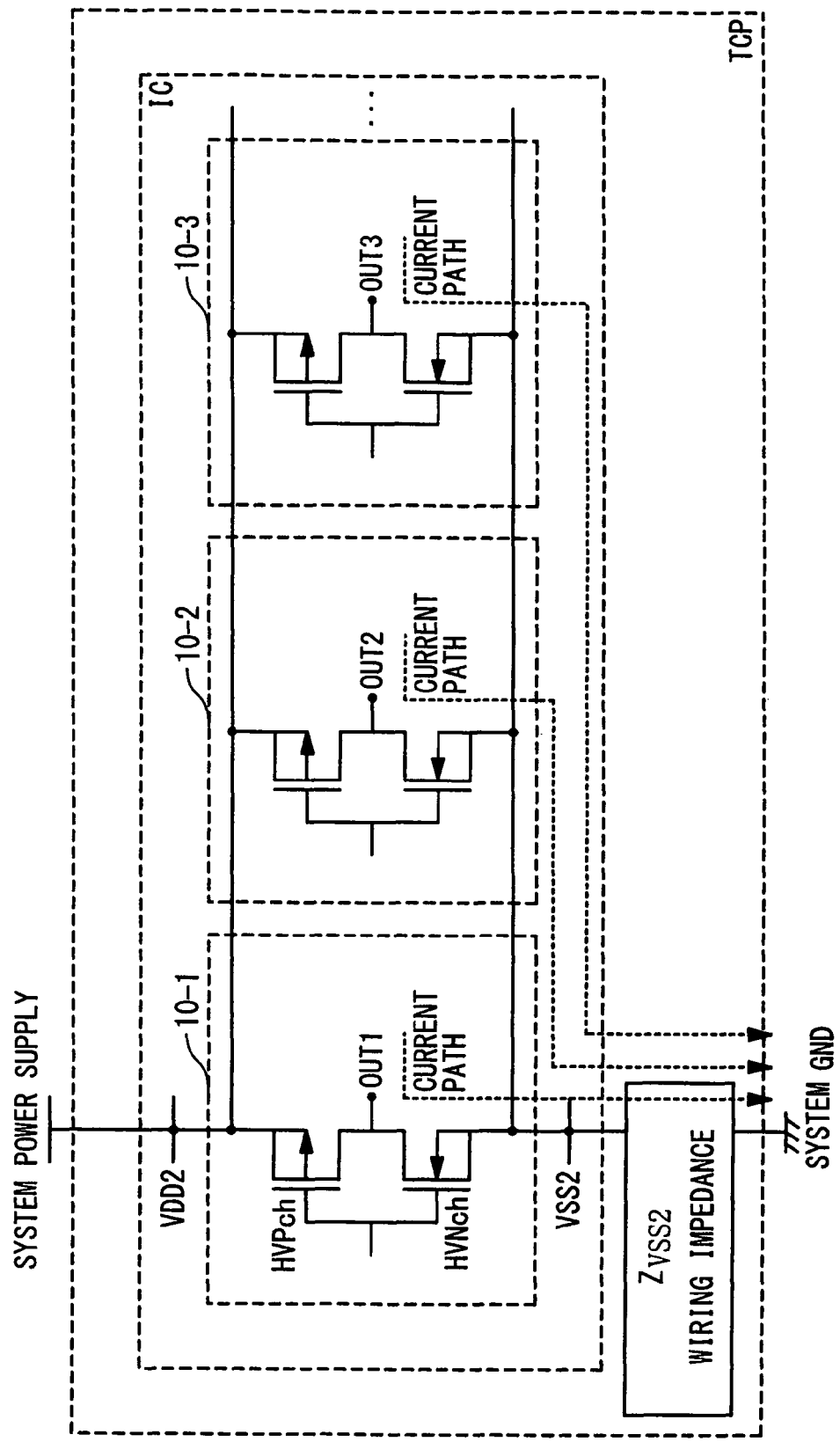
FIG. 2 is a diagram showing a configuration example of a TCP-mounted address driver IC.
Figure 3:
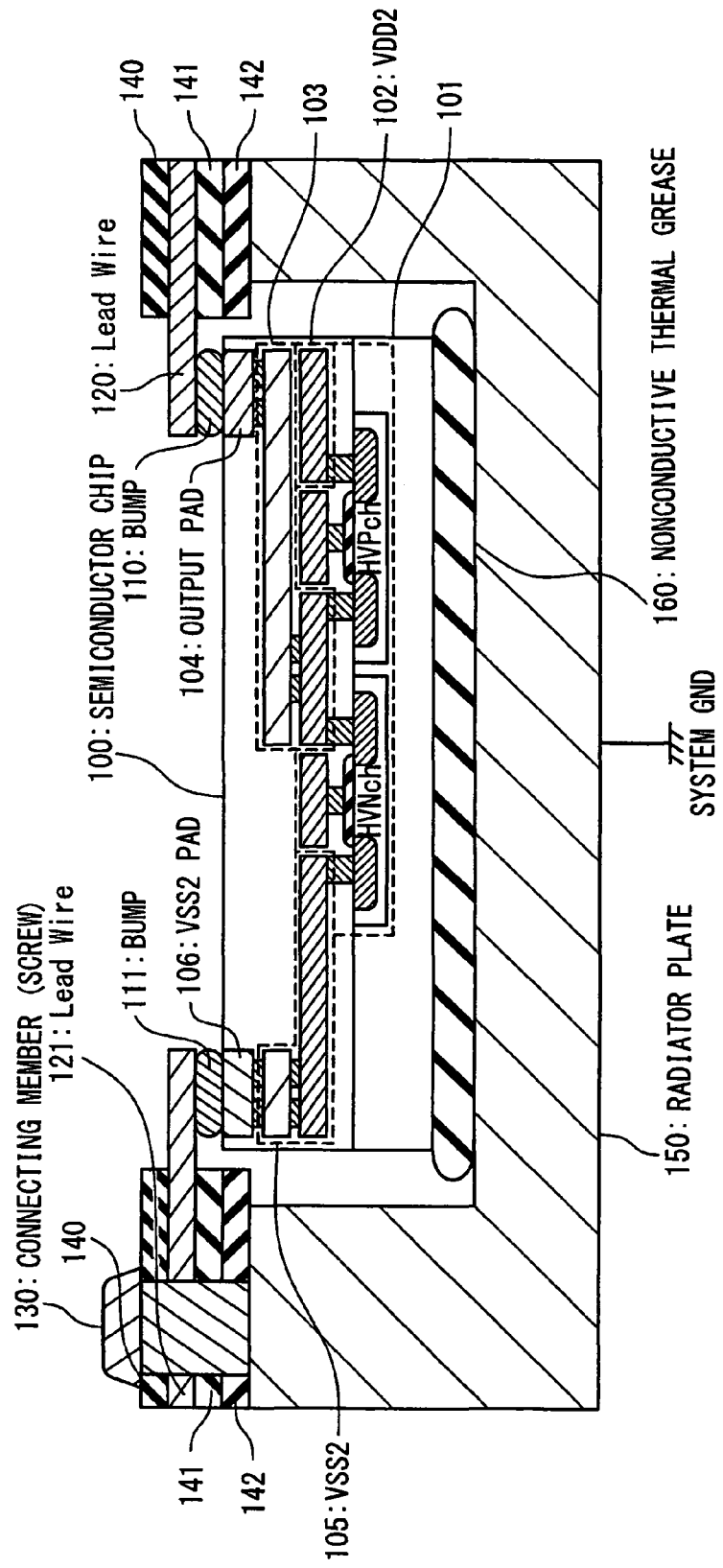
FIG. 3 is a cross sectional view showing a configuration of a semiconductor device described in Japanese Patent Publication JP-2008-203376A.
Figure 4:
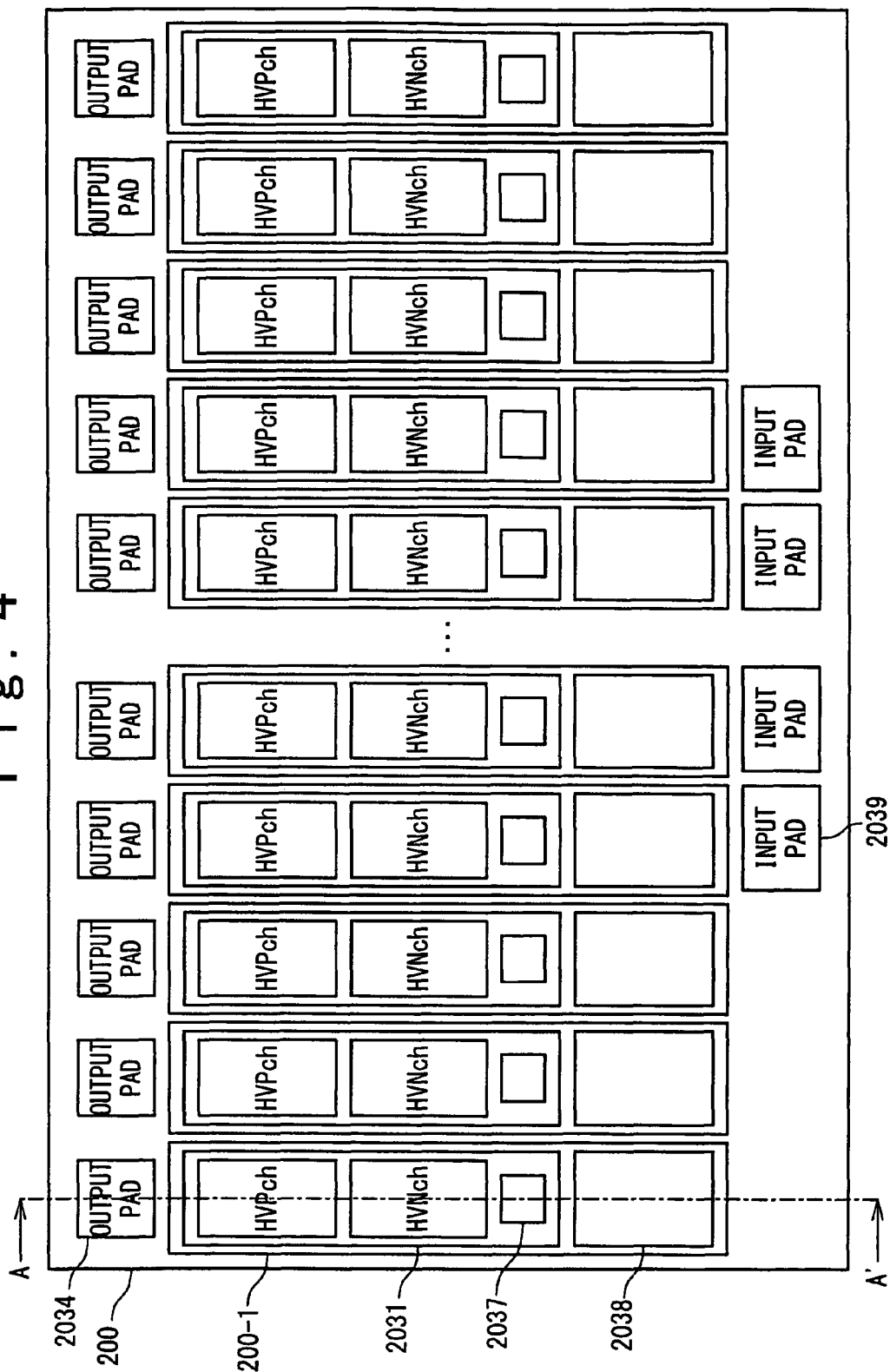
FIG. 4 is a plan view showing a configuration of a semiconductor device according to an embodiment of the present invention.

FIG. 4 is a plan view showing a configuration of a semiconductor device in an embodiment of the present invention. An address driver IC 200 (PDP address driver IC) is provided with a plurality of output cells 200-1. Each of the output cells 200-1 is provided with a high-voltage output part 2031 and a low-voltage logic part 2038. The high-voltage output part 2031 of the present embodiment is provided with a high-voltage P-channel MOSFET (Metal Oxide Semiconductor Field Effect Transistor) (hereinafter referred to as a HVPch), a high-voltage N-channel MOSFET (hereinafter referred to as a HVNch), and a contact hole 2037. Furthermore, the address driver IC 200 is provided with an output pad 2034 corresponding to each of the plurality of output cells 200-1, and an input pad 2039 for inputting an image data.

Figure 5:
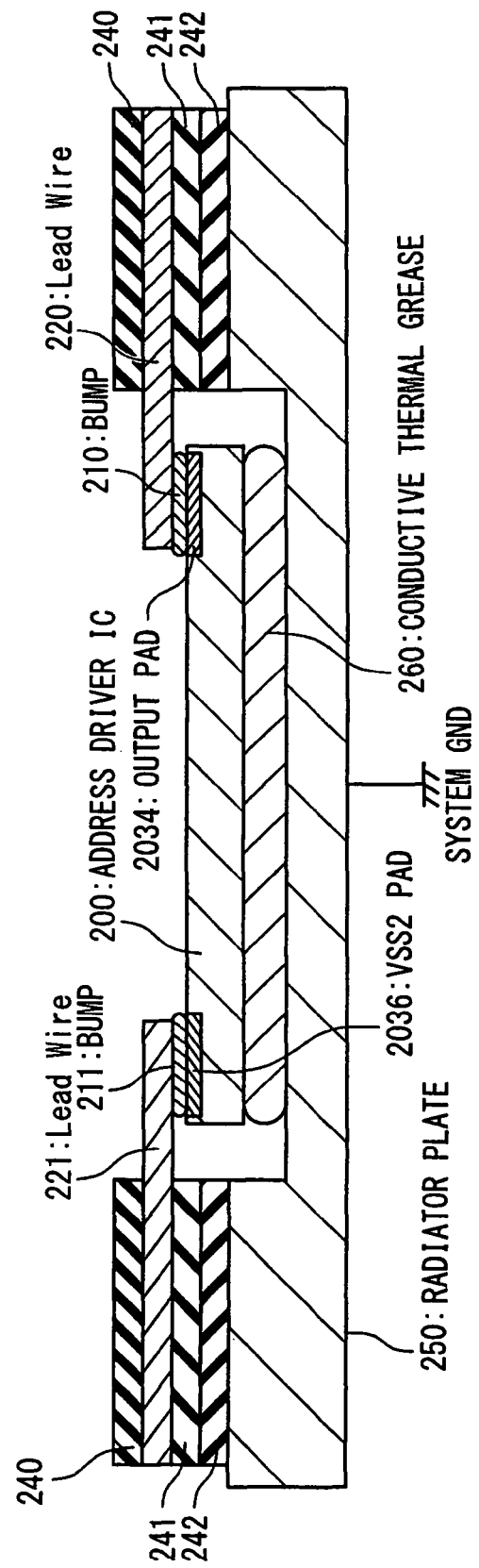
FIG. 5 is a cross sectional view showing a configuration of a semiconductor device according to the embodiment of the present invention.

FIG. 5 is a cross sectional view showing a configuration of the semiconductor device according to the present embodiment. FIG. 5 is a cross sectional view taken along a line A-A' in FIG. 4. In FIG. 5, the address driver IC 200 is packaged in a form of TCP (Tape Carrier Package).

A radiator plate 250 has a recess for mounting the address driver IC 200. The address driver IC 200 is placed in the recess of the radiator plate 250. Conductive thermal grease 260 is applied to an interface between the radiator plate 250 and the address drive IC 200. The conductive thermal grease 260 is applied in a region where the radiator plate 250 faces the address driver IC 200.

The conductive thermal grease 260 is, for example, silicone grease in which metal particles having conductivity are uniformly blended. It should be noted that constituent of the conductive thermal grease 260 is not limited to that. There is no particular limitation on electrical characteristics of the conductive thermal grease 260. In the semiconductor device of the present embodiment, the address driver IC 200 and the radiator plate 250 are electrically connected by means of the conductive thermal grease 260. Any constituent and electrical characteristics are possible as long as the conductive thermal grease 260 has typical radiation characteristic and electrically connects the address driver IC 200 and the radiator plate 250. The conductive thermal grease 260 is not necessarily limited to grease as long as it has conductivity, but may be, for example, a pasty conductor that is not solidified over time. As a material that is solidified, for example, silver paste that is conventionally used for fixing a chip to a package is not suitable for an object of the present invention because it gives a chip a mechanical stress and thus the reliability of the electrical connection cannot be ensured.

The address driver IC 200 is provided with an output pad 2034 and a VSS2 pad 2036. A bump 210 is formed on the output pad 2034. The bump 210 is connected to an inner lead (Lead Wire) 220 of the TCP. Furthermore, a bump 211 is formed on the VSS2 pad 2036. The bump 211 is connected to an inner lead (Lead Wire) 221 of the TCP.

The inner leads 220 and 221 are formed on a base film 241 that is fixed to the radiator plate 250 by a double-faced tape 242. Surfaces of the inner leads 220 and 221 are covered with solder resist 240. The inner lead 220, which is an output of the address driver IC, is connected to a data line of the PDP. Moreover, the inner lead 221 is connected to the GND potential VSS2.

The radiator plate 250 is connected to the system GND and is maintained at a predetermined potential. Here, the predetermined potential is a ground (GND) potential that is used as a constant reference potential in the address driver IC 200. A PDP panel set typically uses a metal chassis of the PDP panel set as the system GND. The radiator plate 250 is connected to the metal chassis to be supplied with the GND potential.

Figure 6:
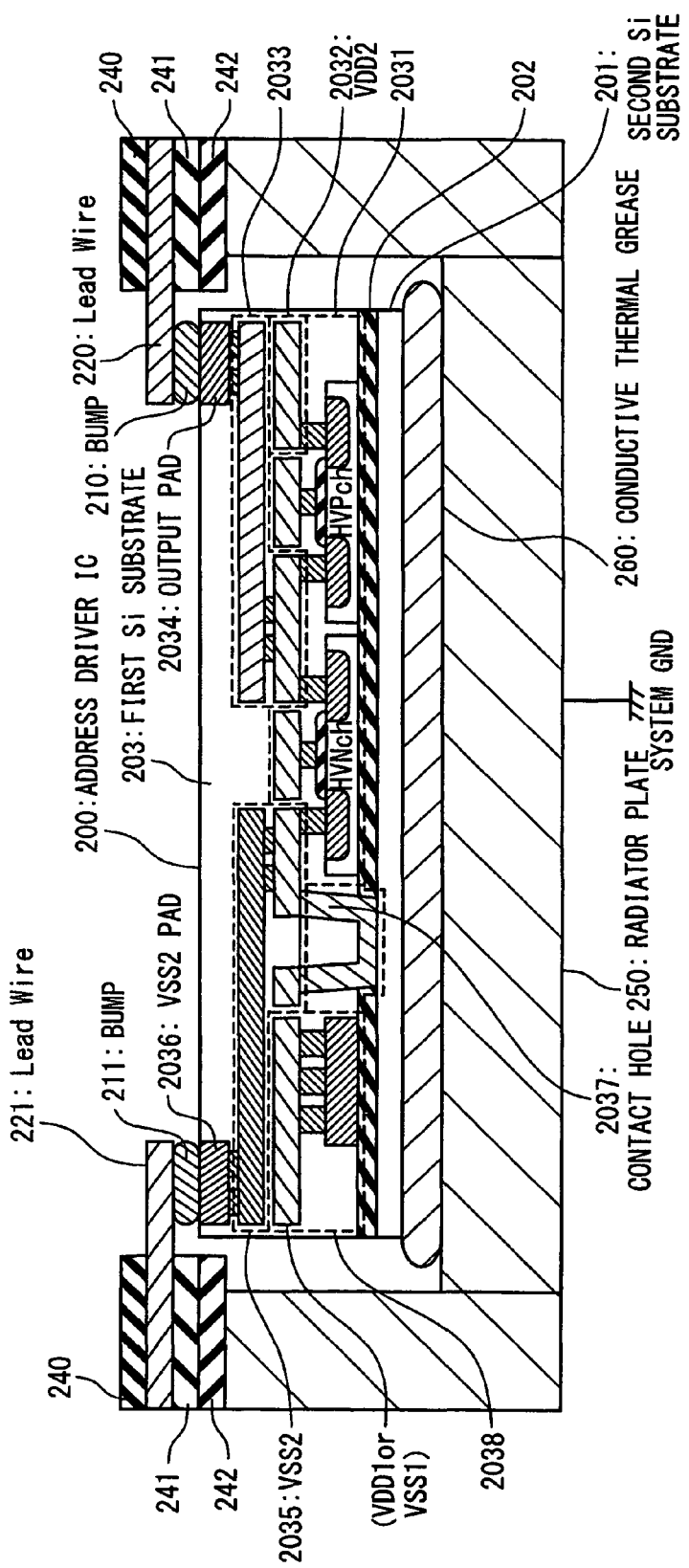
FIG. 6 is a cross sectional view showing a detailed configuration of the semiconductor device according to the embodiment of the present invention.

FIG. 6 is a cross sectional view showing a detailed configuration of the semiconductor device according to the present embodiment. FIG. 6 shows the configuration of the address driver IC 200 shown in FIG. 5 in more detail.

The address driver IC 200 in the present embodiment is an SOI (Silicon On Insulator) chip. Specifically, the address driver IC 200 has a first silicon (Si) substrate 203, a second silicon (Si) substrate 201 and an insulating film 202. The second Si substrate 201, the insulating film 202 and the first Si substrate 203 are stacked in this order. The second Si substrate 201 is a base substrate that faces the radiator plate 250. The insulating film 202, which is for example a silicon oxide film (SiO2 film), is formed on the second Si substrate 201. The first Si substrate 203 is formed on the insulating film 202. In the present embodiment, a side of the second Si substrate 201 is referred to as a back surface side of the address driver IC 200, and a side of the first Si substrate 203 is referred to as a front surface side of the address driver IC 200.

Circuit elements are formed on the first Si substrate 203. In other words, the first Si substrate 203 forms a circuit element part. The low-voltage logic part 2038 and the high-voltage output part 2031 are formed on the first Si substrate 203.

The low-voltage logic part 2038 is connected to a wiring layer through a via. The low-voltage logic part 2038 receives the VDD1 and VSS1 through the wiring layer, and is connected to the high-voltage output part 2031 through the wiring layer, and also to the input pad 2039 for inputting the image data. The configuration and connection relationship of the low-voltage logic part 2038 are similar to the conventional ones, and description thereof is omitted.

The HVPch and the HVNch are formed in the high-voltage output part 2031. The HVPch is connected through a via to a VDD2 wiring 2032 formed on the first Si substrate 203 and receives the VDD2 through the VDD2 wiring 2032. The HVPch and the HVNch are connected through vias to an output wiring 2033 formed on the first Si substrate 203. The output wiring 2033 is connected to the output pad 2034 through a via. As described above, the bump 210 is provided on the output pad 2034, and the bump 210 is connected to the inner lead (Lead Wire) 220 of the TCP. The HVPch and the HVNch are electrically connected to the output wiring 2033, the output pad 2034, the bump 210 and the inner lead 220 to output an output signal to the data line through the inner lead 220. Moreover, the HVPch and the HVNch are connected to the low-voltage logic part 2038 through a wiring layer (not shown) formed on the first Si substrate 203.

What is important in the present embodiment is a connection configuration with the GND (ground) potential VSS2 in the high-voltage output part 2031. The HVNch of the high-voltage output part 2031 is connected through a via to a VSS2 wiring 2035 formed on the first Si substrate 203. The VSS2 wiring 2035 is connected to a GND (ground) pad 2036 through a via. As described above, the bump 211 is formed on the GND pad 2036, and the bump 211 is connected to the inner lead (Lead Wire) 221 of the TCP. The inner lead 221 is connected to the GND potential VSS2. Therefore, the HVNch of the high-voltage output part 2031 is electrically connected to the inner lead 221 through the VSS2 wiring 2035, the VSS2 pad 2036 and the bump 211 to be supplied with the GND potential VSS2.

Furthermore, the high-voltage output part 2031 of the present embodiment has the contact hole 2037. The contact hole 2037 extends from the first Si substrate 203 and penetrates through the insulating film 202 to reach the second Si substrate 201. The contact hole 2037 is formed of a metal film and electrically connects the VSS2 wiring 2035 and the second Si substrate 201.

In the present embodiment, the contact hole 2037 is formed based on a technique disclosed in Japanese Patent Publication JP-2002-110950A (hereinafter referred to as Patent Document 2). The Patent Document 2 discloses an SOI chip semiconductor device having a substrate contact region. The semiconductor device disclosed in the Patent Document 2 will be explained below. Note that reference numerals for the explanation here are the same as those used in the Patent Document 2. The semiconductor device disclosed in the Patent Document 2 is provided with a substrate contact region 10 of 10×10 μm square on a second Si substrate 2 for forming a circuit element. In the substrate contact region 10, a contact hole 13 extending from the second Si substrate 2 to a first Si substrate 1 through an SiO2 film 3 is provided. The contact hole 13 is filled with metal, such as tungsten (W) 15c. Furthermore, the substrate contact region 10 is provided with a metal film wiring 16G formed of, for example, aluminum (Al) that connects a bottom surface of the substrate contact region 10 to a predetermined external connection electrode 200G provided on a principal surface of the second Si substrate 2. The metal film wiring 16G is electrically connected to the contact hole 13 at the bottom surface of the substrate contact region 10. The fist Si substrate 1 and the external connection electrode 200G are thus electrically connected through the contact hole 13 and the metal wiring film 16G.

This is the explanation of the Patent Document 2. The external connection electrode 200G in the Patent Document 2 corresponds to the VSS2 wiring 2035 in the present embodiment. The contact hole 2037 in the present embodiment includes the substrate contact region 10 and the contact hole 13 in the Patent Document 2. The contact hole 2037 in the present embodiment electrically connects the second Si substrate 201 and the VSS2 wiring 2035.

As described above, the second Si substrate 201 is electrically connected to the radiator plate 250 through the conductive thermal grease 260. The radiator plate 250 is connected to the system GND. Therefore, the second Si substrate 201 and the system GND are electrically connected to each other through the conductive thermal grease 260. The HVNch of the high-voltage output part 2031 is electrically connected to the radiator plate 250 through the VSS2 wiring 2035, the contact hole 2037, the second Si substrate 201 and the conductive thermal grease 260. The high-voltage output part 2031 is supplied with the GND potential VSS2 from the system GND through this path, and its wiring length can be shorter as compared with a case where the high-voltage output part 2031 is connected to the system GND through the TCP inner lead. As a result, the wiring impedance from the high-voltage output part 2031 to the system GND can be reduced, which can stabilize the GND potential VSS2. In the present embodiment described above, the second Si substrate 201 and the VSS2 wiring 2035 are electrically connected by means of the technique disclosed in the Patent Document 2. It should be noted that other techniques also are applicable as long as the second Si substrate 201 and the VSS2 wiring 2035 are electrically connected to each other.

In the semiconductor device shown in FIG. 6, the address driver IC 200 has two paths for being supplied with VSS2: the first path is through the inner lead 221 of the TCP while the second path is through the conductive thermal grease 260. In the case of the first path wherein the VSS 2 is supplied through the inner lead 221 of the TCP, the HVNch of the high-voltage output part 2031 is connected to the VSS2 through the VSS2 wiring 2035, the VSS2 pad 2036, the bump 211 and the inner lead 221. On the other hand, in the case of the second path wherein the VSS2 is supplied through the conductive thermal grease 260, the HVNch of the high-voltage output part 2031 is connected to the system GND through the VSS2 wiring 2035, the contact hole 2037, the second Si substrate 201, the conductive thermal grease 260 and the radiator plate 250.

Figure 7:
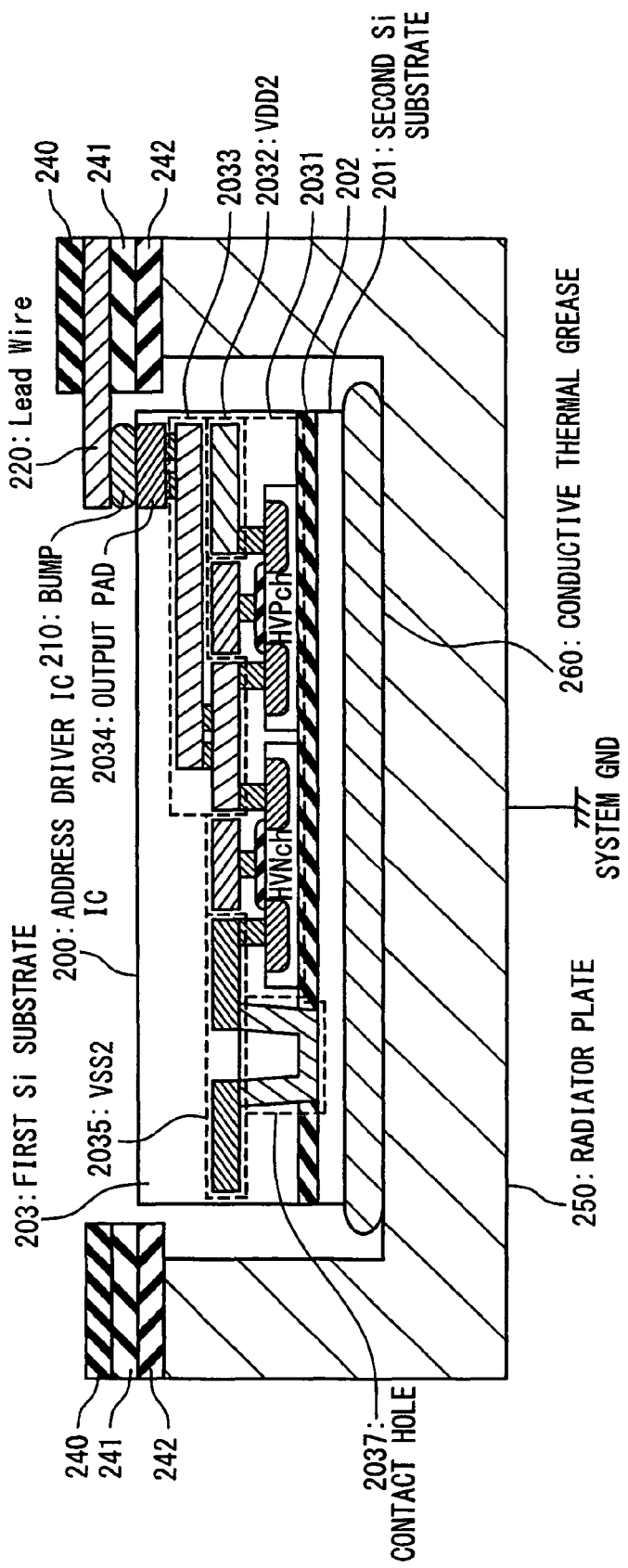
FIG. 7 is a cross sectional view showing a configuration in which a path for supplying VSS2 through an inner lead is omitted in the semiconductor device according to the embodiment of the present invention.

The first path wherein the VSS2 is supplied through the inner lead 221 may be omitted. In this case, there exists only the second path wherein the VSS2 is supplied through the conductive thermal grease 260. FIG. 7 is a cross sectional view showing a configuration without the path for being supplied with VSS2 through the inner lead 221 in the semiconductor device of the present embodiment. In the semiconductor device shown in FIG. 7, the address driver IC 200 has only the path that connects the HVNch of the high-voltage output part 2031 to the system GND through the VSS2 wiring 2035, the contact hole 2037, the second Si substrate 201, the conductive thermal grease 260 and the radiator plate 250. Such a configuration makes it possible to achieve the address driver IC 200 with a simple configuration.

Figure 8:
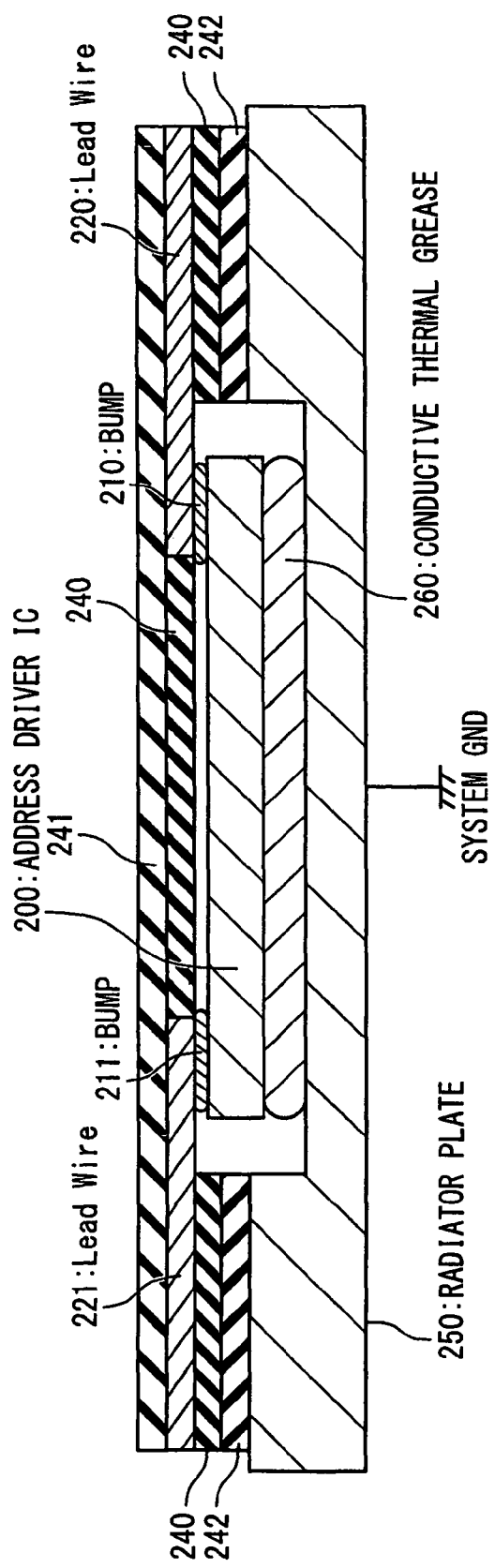
FIG. 8 is a cross sectional view showing a COF mounted address driver IC 200 in the semiconductor device of the embodiment of the present invention.

In the embodiment described above, the address driver IC 200 is packaged in a form of TCP. Alternatively, the address driver IC 200 may be packaged in a form of COF (Chip On Film). FIG. 8 is a cross sectional view showing a case where the address driver IC 200 of the semiconductor device in the present embodiment is COF mounted. Such a configuration makes it possible to support a flip chip. In addition, also in the COF mounting, it is possible to configure the address driver IC 200 described above using only the path for being supplied with the GND potential through the conductive thermal grease 260.

The semiconductor device of the present embodiment has been described. According to the semiconductor device of the present embodiment, the conductive thermal grease 260 is applied to the contact interface between the address driver IC 200 as an SOI chip and the radiator plate 250. Moreover, the address driver IC 200 is provided with the contact hole 2037 extending from the first Si substrate 203 constituting the circuit elements and penetrating through the insulating layer 202 to reach the second Si substrate 201 facing the radiator plate 250. The contact hole 2037 electrically connects the second Si substrate 201 and the VSS2 wiring 2035 formed on the first Si substrate 203. The VSS2 wiring 2035 is connected to the HVNch of the high-voltage output part 2031. The HVNch of the high-voltage output part 2031 is thus electrically connected to the system GND through the VSS2 wiring 2035, the contact hole 2037, the second Si substrate 201, the conductive thermal grease 260 and the radiator plate 250. Since the high-voltage output part 2031 is thus connected to the system GND through this path, the wiring length can be shortened as compared with a case where the high-voltage output part 2031 is connected to the system GND through the inner lead 221 of the TCP. It is thus possible to reduce the wiring impedance and to suppress the fluctuation in the GND potential VSS2 used in the high-voltage output part 2031. As a result, the stable GND potential can be supplied to the address driver IC 200.

It is apparent that the present invention is not, limited to the above embodiments and may be modified and changed without departing from the scope and spirit of the invention.

What is claimed is:

1. A semiconductor device comprising:
a radiator plate that is maintained at a predetermined potential;
an SOI (Silicon On Insulator) chip mounted on said radiator plate; and
thermal grease applied to an interface between said radiator plate and said SOI chip,
wherein said SOI chip comprises:
a first silicon substrate forming a circuit element part;
a second silicon substrate facing said radiator plate; and
an insulating film formed between said first silicon substrate and said second silicon substrate,
wherein said first silicon substrate and said second silicon substrate are electrically connected to each other, and
said thermal grease is conductive and electrically connects said second silicon substrate and said radiator plate.

2. The semiconductor device according to claim 1,
wherein said SOI chip further comprises a contact hole that penetrates from said first silicon substrate through said insulating film to reach said second silicon substrate, and
said contact hole electrically connects said second silicon substrate and a ground electrode formed in said circuit element part.

3. The semiconductor device according to claim 1,
wherein said SOI chip is packaged in a form of TCP (Tape Carrier Package) or COF (Chip On Film).

4. The semiconductor device according to claim 3,
wherein in said TCP or said COF, said contact hole is connected to an inner lead that supplies said predetermined potential.

5. The semiconductor device according to claim 1,
wherein said predetermined potential is a ground potential in said circuit element part.

6. The semiconductor device according to claim 2,
wherein said circuit element part forms a PDP (Plasma Display Panel) address driver circuit,
said PDP address driver circuit comprises a high-voltage output part and a low-voltage logic part, and
said contact hole electrically connects said second silicon substrate and said ground electrode of said high-voltage output part.

* * * * *